US009002186B2

(12) United States Patent
Akers et al.

(10) Patent No.: US 9,002,186 B2
(45) Date of Patent: Apr. 7, 2015

(54) CONTROLLING THE TEMPERATURE OF AN OBJECT

(71) Applicant: Teradyne, Inc., North Reading, MA (US)

(72) Inventors: Larry W. Akers, Westford, MA (US); Nathan Blosser, Beverly, MA (US); Brian S. Merrow, Harvard, MA (US)

(73) Assignee: Teradyne, Inc., North Reading, MA (US)

( * ) Notice: Subject to any disclaimer, the term of this patent is extended or adjusted under 35 U.S.C. 154(b) by 268 days.

(21) Appl. No.: 13/633,741

(22) Filed: Oct. 2, 2012

(65) Prior Publication Data

US 2013/0108253 A1 May 2, 2013

Related U.S. Application Data

(60) Provisional application No. 61/553,681, filed on Oct. 31, 2011.

(51) Int. Cl.
*F24H 1/10* (2006.01)
*F24D 19/02* (2006.01)
*H05K 7/20* (2006.01)

(52) U.S. Cl.
CPC ........ *H05K 7/20563* (2013.01); *H05K 7/20145* (2013.01)

(58) Field of Classification Search
None
See application file for complete search history.

(56) References Cited

U.S. PATENT DOCUMENTS

| 5,477,417 | A | * | 12/1995 | Ohmori et al. | 361/695 |
|---|---|---|---|---|---|
| 6,104,002 | A | * | 8/2000 | Hirose et al. | 219/390 |
| 6,399,923 | B2 | * | 6/2002 | Kano et al. | 219/411 |
| 6,512,672 | B1 | | 1/2003 | Chen | |
| 7,022,192 | B2 | * | 4/2006 | Dip et al. | 118/725 |
| 7,932,734 | B2 | * | 4/2011 | Merrow et al. | 324/750.03 |
| 7,995,349 | B2 | * | 8/2011 | Merrow et al. | 361/728 |
| 8,466,699 | B2 | * | 6/2013 | Merrow et al. | 324/750.03 |
| 8,547,123 | B2 | * | 10/2013 | Merrow et al. | 324/750.06 |
| 8,628,239 | B2 | * | 1/2014 | Merrow et al. | 374/141 |
| 2008/0094799 | A1 | | 4/2008 | Zieman et al. | |
| 2010/0020486 | A1 | | 1/2010 | Narasimhan et al. | |
| 2011/0012632 | A1 | * | 1/2011 | Merrow et al. | 324/750.03 |
| 2011/0013667 | A1 | * | 1/2011 | Merrow et al. | 374/141 |
| 2011/0303100 | A1 | * | 12/2011 | Agnello et al. | 99/443 |

OTHER PUBLICATIONS

PCT Notification of Transmittal of International Search Report and Written Opinion of the International Searching Authority from International Application No. PCT/US2012/058454, dated Mar. 25, 2013, 9 pages.

* cited by examiner

*Primary Examiner* — Thor Campbell
(74) *Attorney, Agent, or Firm* — Fish & Richardson P.C.

(57) ABSTRACT

An apparatus for controlling the temperature of an object, comprises: a housing comprising: a cavity adapted to accept an object, an air inlet configured to allow air to flow into the cavity, and an air outlet configured to allow air to flow out of the cavity; and a nest configured to hold the object within the housing such that the smallest planar dimension of the object is substantially aligned with the smallest planar dimension of the cavity; wherein the nest and housing are adapted to direct air flow from the air inlet, substantially in parallel across at least one surface of the object and in the direction of the smaller dimension of the at least one surface, to the air outlet.

16 Claims, 12 Drawing Sheets

CONTROLLING THE TEMPERATURE OF AN OBJECT

CLAIM OF PRIORITY

This application claims priority under 35 U.S.C. §119(e) to provisional U.S. Patent Application No. 61/553,681, filed on Oct. 31, 2011, the entire contents of which are hereby incorporated by reference.

BACKGROUND

The present disclosure is in the technical field of temperature control of objects by means of directing air across one or more surfaces of the object.

It is known in the art that the temperature of objects may be raised, lowered, or controlled at a specific level by directing a flow of air across the object. The temperature, velocity, turbulence, and/or volumetric flow of the air may be varied in order to effect the temperature control of the object. If the object dissipates power of its own, temperature control may be further enhanced by measuring or controlling the amount of power dissipated by the object, in addition to the properties of the flow of air.

In cases where the temperature of multiple objects must be controlled at the same time, especially where each object must be at a different temperature and/or dissipates a different or varying amount of power, a separate air flow may be used for each object. This is common during the manufacture of electronic devices or assemblies, or of electromechanical devices. It may also be common during the manufacture or testing of biological agents or samples. Each separate air flow may draw from a common source of air, such as the ambient air or a controlled reservoir of air. Alternatively, each air flow may be a circulating flow of air where the entire path is separate from the flow of air for other objects. In applications where objects need to have their temperatures controlled for different lengths of time, or when objects are continuously processed rather than processed as a large batch, it may be advantageous to allow manual or automated replacement of each object without affecting the state or air flow of other objects.

The efficiency of object replacement in a temperature control apparatus may be enhanced by concentrating the access to the objects in to a small area. If object replacement is by automated means, concentrating object access into small area reduces the required size and reach of an automated transporter, and reduces travel time between object locations. If object replacement is by a human operator, concentrating object access into small area allows more objects to be located in an ergonomic access window, and reduces the amount of walking or movement required by the human operator.

Accordingly, maximizing the density of the object access area of a temperature control apparatus requires making the cavities, drawers, shelves, or other control volumes that support the object while its temperature is being controlled, as small as possible in the dimension of the plane or planes facing the operator or automated transporter. For objects of fixed dimensions, the lower limit on the size of the access point is equal to the smallest planar dimension of the object placed in the control volume. It is therefore advantageous to insert and remove the object with its smallest planar dimension facing the operator or mechanical transporter. Furthermore, each air flow through the temperature control apparatus is preferably along an axis that is substantially perpendicular to the smallest planar dimension of the object. (See note on common reservoir above). Air flow along any other axis may require duct work and/or air movers that require space that could otherwise be used to place the objects closer together while in the temperature control apparatus. Unfortunately, not all objects can be optimally temperature controlled by an air flow along an axis that is substantially perpendicular to their smallest planar dimension, possibly because of uneven heat distribution, self-heating effects, high air flow resistance, or other considerations.

It would be advantageous for a temperature control apparatus to both present the minimum area to an operator or automated transporter, and to permit the air flow across the object to be along an axis or path that is not substantially perpendicular to that smallest area.

SUMMARY

In one aspect of the present disclosure, an apparatus for controlling the temperature of an object, including: a housing including: a cavity adapted to accept an object, an air inlet configured to allow air to flow into the cavity, and an air outlet configured to allow air to flow out of the cavity; and a nest configured to hold the object within the housing such that the smallest planar dimension of the object is substantially aligned with the smallest planar dimension of the cavity; wherein the nest and housing are adapted to direct air flow from the air inlet, substantially in parallel across at least one surface of the object and in the direction of the smaller dimension of the at least one surface, to the air outlet.

Implementations of the disclosure can include one or more of the following features. In some implementations, the aspect ratio of the largest planar surface of the housing is greater than 2:1. In other implementations, the nest is adapted to be removable from the housing. In still other implementations, the apparatus includes a heating element disposed in the path between the air inlet and the object. In still other implementations, the apparatus includes a temperature sensor.

In other implementations, the smallest planar dimension of the cavity is substantially parallel to the smallest planar dimension of the housing. In some implementations, the air inlet is placed in the smallest planar dimension of the cavity. In other implementations, the air outlet is placed so the air flow from the air inlet to the air outlet is along the longest axis of the cavity. In other implementations, the angle between the smallest planar surface of the object and the smallest planar surface of the cavity is less than 20 degrees.

In another aspect of the disclosure, an apparatus for controlling the temperature of an object, including: a housing including: a cavity adapted to accept the object, an air inlet configured to allow air to flow into the cavity, and an air outlet configured to allow air to flow out of the cavity; and a nest configured to hold the object within the housing such that the largest linear dimension of the object is substantially aligned with the diagonal of the largest planar dimension of the cavity; wherein the nest and housing are adapted to direct air flow from the air inlet, substantially in parallel across at least one surface of the object and in the direction of the smaller dimension of the at least one surface, to the air outlet.

Implementations of this aspect of the present disclosure can include one or more of the following features. In some implementations, the aspect ratio of the largest planar surface of the housing is greater than 2:1. In other implementations, the nest is adapted to be removable from the housing. In still other implementations, the apparatus further includes a heating element disposed in the path between the air inlet and the object. In some implementations, the apparatus further includes a temperature sensor. In still other implementations, the nest and housing are further adapted to provide a substantially wedge-shaped air inlet plenum between the air inlet and the object. In some implementations, the nest and housing are further adapted to provide an air plenum with a progressively reduced cross-sectional area disposed between the housing and the at least one surface of the object.

DETAILED DESCRIPTION

A system consistent with this disclosure is configured to create an air flow across one or several surfaces of an object that is placed in a test slot. The test slot is configured to have its smallest surface facing a human operator or automated transporter, so that an apparatus including multiple test slots may present a large number of test slots in a small area. The overall direction of the air flow through the apparatus is along an axis oriented perpendicular to the smallest surface of the test slot, but the apparatus contains provisions to direct the air flow along a direction more advantageous for efficient temperature control of an object contained in the test slot. The apparatus also contains provisions for directing the air flow along specific surfaces of the object contained therein, for heating the air flow or object, and for making electrical or other connections to the object.

As described herein, a method of controlling the temperature of an object uses an air flow that is substantially perpendicular to the smallest planar dimension of the object, while locally directing the air flow along a direction more advantageous for efficient temperature control of the object.

Figure 1:
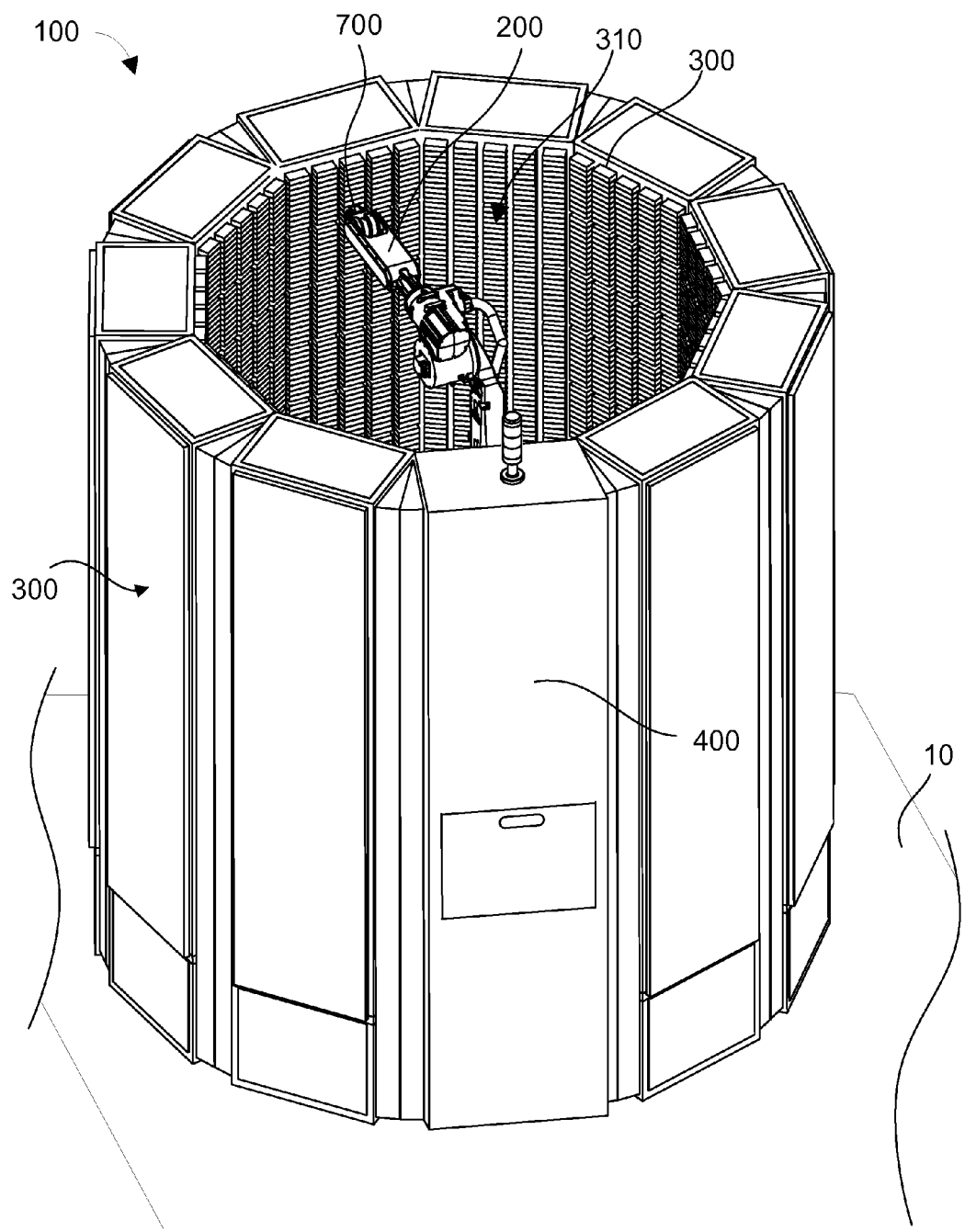
FIGS. 1 and 2 are perspective views of a disk drive testing system and a transfer station.
Figure 2:
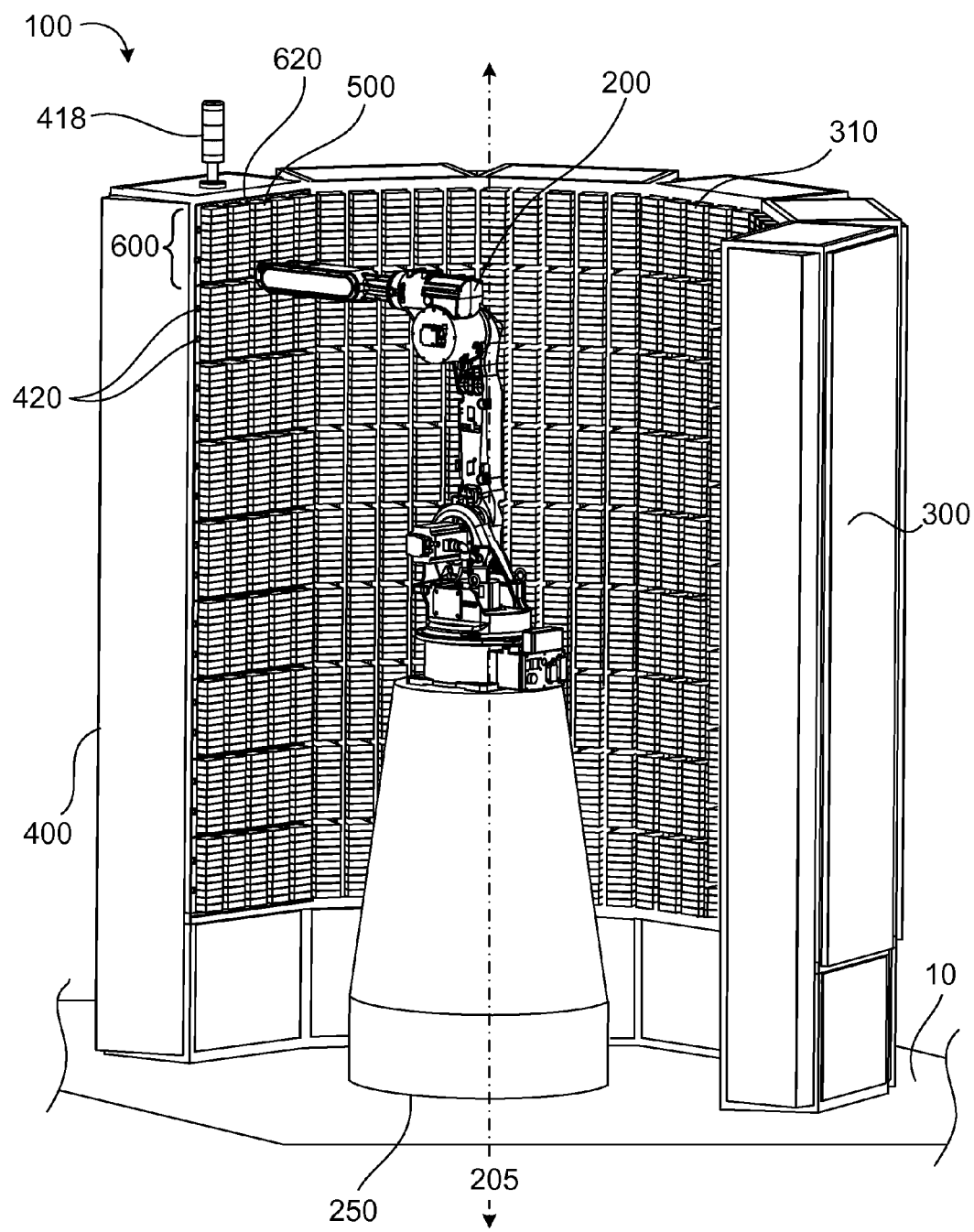

An example of the apparatus is shown in FIGS. 1-2. As shown in FIG. 1, a thermal control system includes a plurality of racks, a transfer station, and an automated transporter. The automated transporter is located in an atrium, which is a space enclosed by the racks and a canopy. The atrium also serves as a reservoir for chilled air. Referring to FIG. 1, the automated transporter includes a robotic arm and a manipulator (sometimes referred to as an end effector) disposed at a distal end of the robotic arm. The robotic arm defines a first axis normal to a floor surface and is operable to rotate through a predetermined arc about and extends radially from the first axis within an automated transporter operating area. The robotic arm is configured to independently service each test slot by transferring thermal adapters between the transfer station and the test racks. In some embodiments, the robotic arm is configured to remove a first thermal adapter with a first object contained therein, from a test slot with the manipulator, deposit the first thermal adapter at a first location in the transfer station, retrieve a second thermal adapter from a second location in the transfer station with the manipulator, and then deposit the second thermal adapter, with a second object contained therein therein, in the test slot for thermal testing or control. After testing or control is complete, the robotic arm retrieves the second thermal adapter, along with the supported second object, from the test slot and returns it to the transfer station (or moves it to another one of the test slots) by manipulation of the storage device transporter (i.e., with the manipulator).

Figure 3:
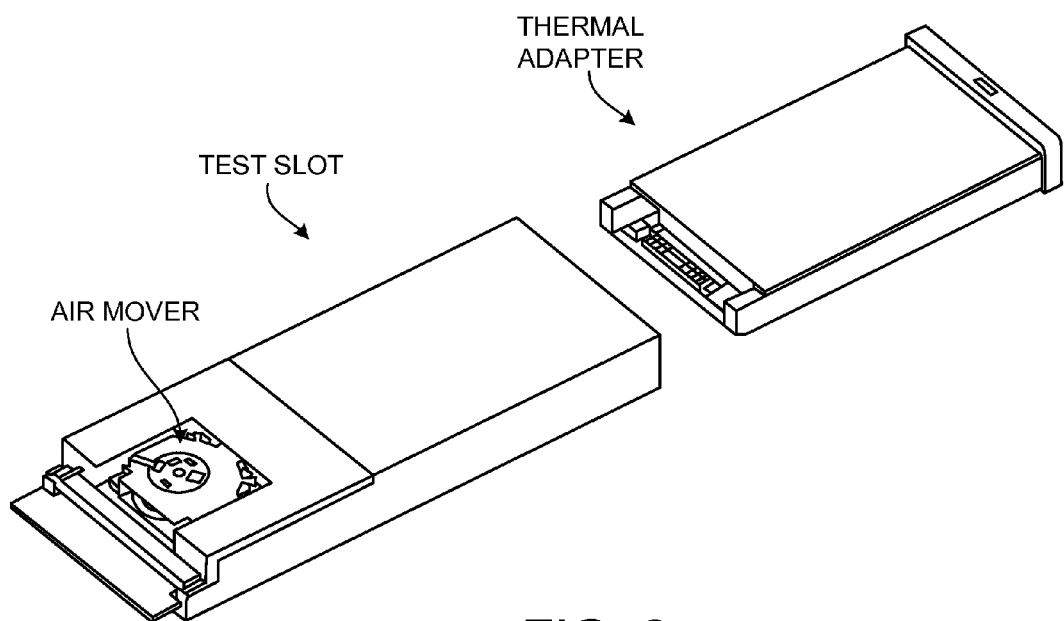
FIGS. 3-14 include diagrams of components used in controlling the temperature of an object.

FIG. 2 shows a perspective view of a thermal control system rack, containing multiple test slot assemblies. In addition to the test slot assemblies, the rack may contain air movers configured to move air from the atrium through the test slots, through a heat exchanger, and back to the atrium. The movement of the air from the atrium through the test slots and through the heat exchanger serves to control the temperature of the air in the atrium, to be used as a common source of controlled air to provide a temperature control source for the test slots As shown in FIG. 3, each test slot assembly may include a test slot and a thermal adapter. The thermal adapter may be removable from the test slot. The test slot may include an associated air mover. The air mover may be configured to create, control, or supplement an air flow through the thermal adapter when it is located in the test slot.

Figure 4:
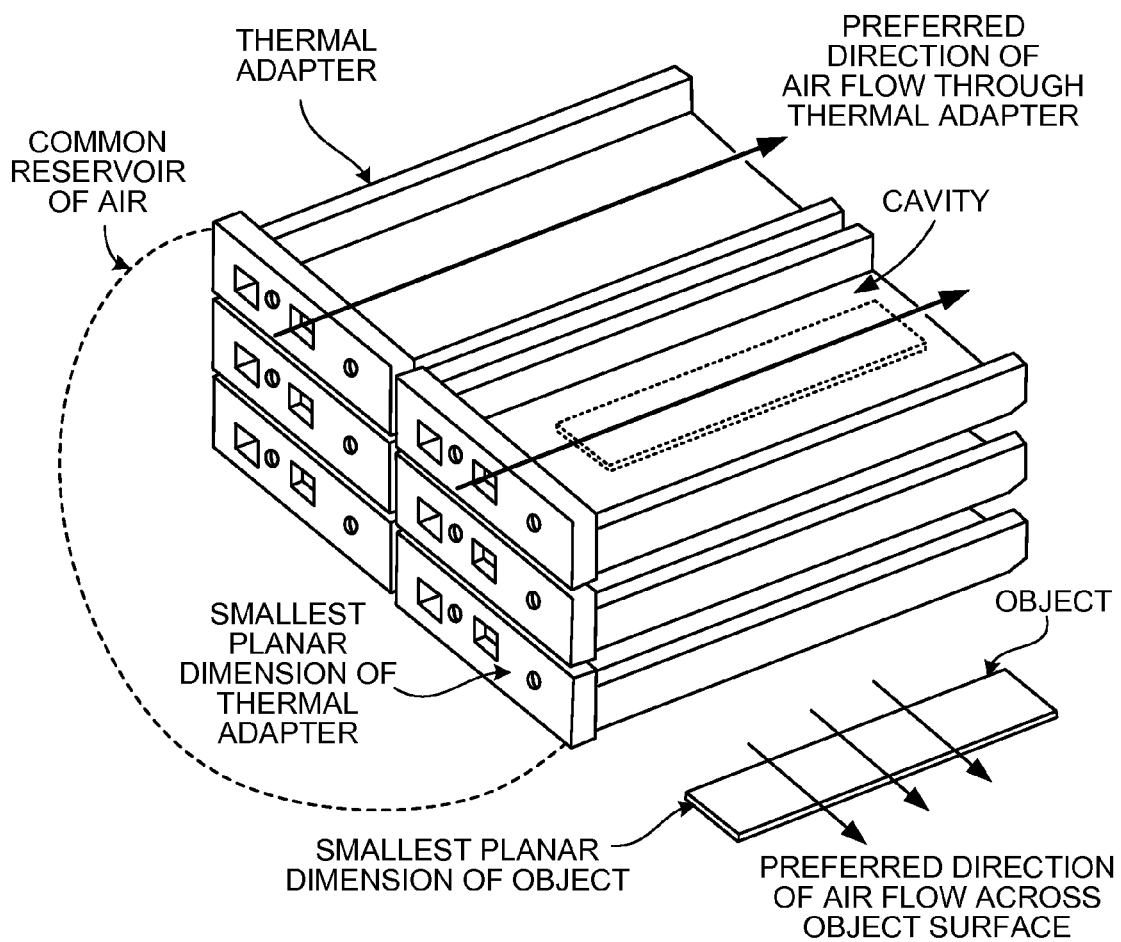
Figure 6:
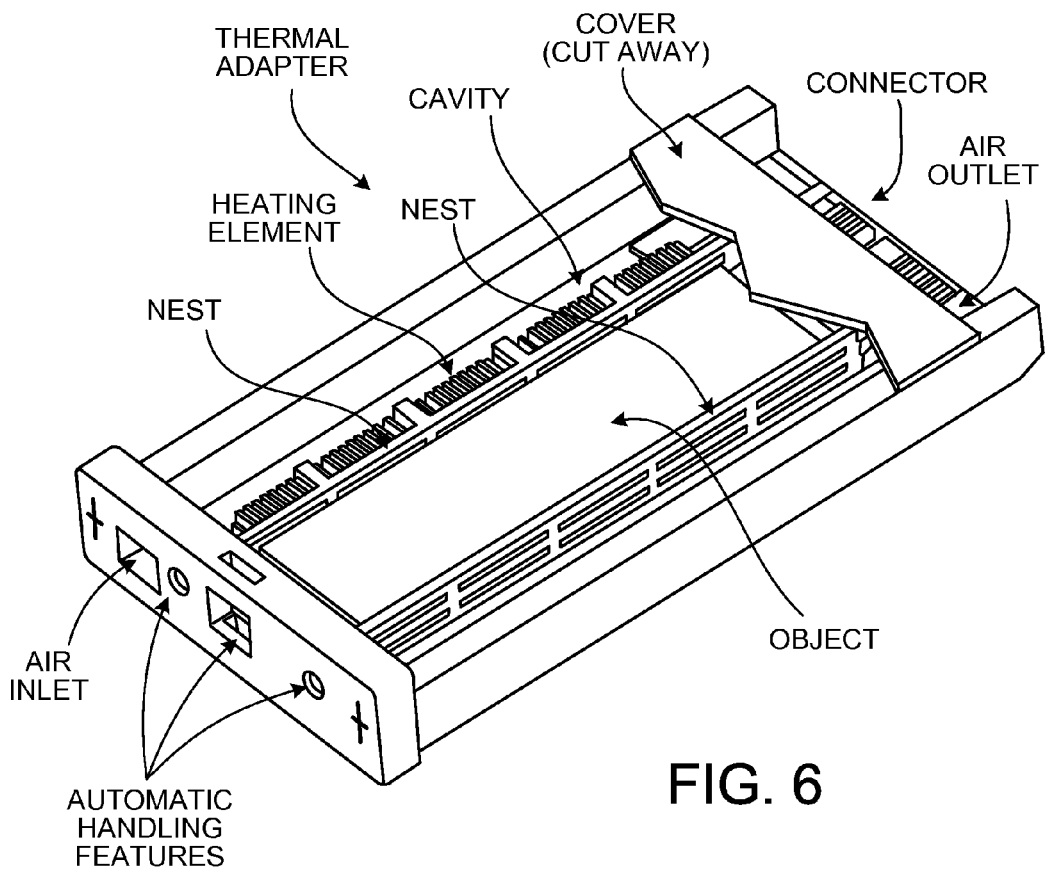
Figure 7:
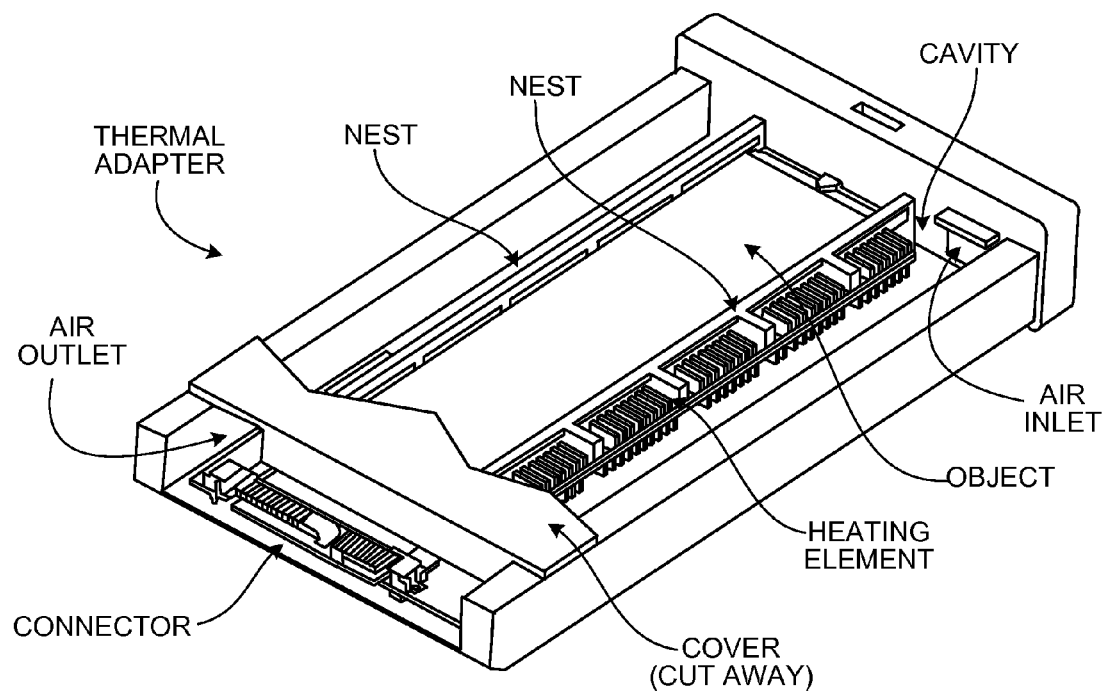

A more detailed view of a thermal adapter is shown in FIGS. 4 and 6-7. The thermal adapter encloses an object which is subject to thermal control in a cavity. To form the cavity, the thermal adapter includes multiple walls or surfaces to separate the air flow over the object from the surrounding environment, and to aid in the direction of the air flow. In some implementations, the walls include a moveable cover. The thermal adapter also includes an air inlet and an air outlet. In some implementations, the air inlet is formed by an aperture in the front wall of the thermal adapter. In some implementations, the air outlet is formed by an aperture in the cover or the rear wall. The object is supported in the thermal adapter by a nest, which supports the object. In some implementations, the nest may include features to control and/or direct air flow over one or more surfaces of the object, sometimes in conjunction with other features of the thermal adapter and test slot.

In some implementations, the thermal adapter will include features to facilitate automated handling of the thermal adapter, for example by a manipulator. In some implementations, a thermal sensor may be disposed on one or more of the air inlet side of the object, the air outlet side of the object, and on the object itself. In some implementations, the thermal adapter comprises a heating element for use in either heating the air flow or for heating the object by direct contact. In such implementations, the thermal adapter may also comprise a thermal sensor in thermal contact with the heating element. In implementations with a heating element and/or one or more thermal sensors, the thermal adapter may include a connector, to allow connections for control of the heating element and monitoring of the thermal sensors.

In some implementations, it is desirable to make electrical contact with the object while it is supported in the test slot. In such implementations, the thermal adapter may include one or more electrical paths from the object connector to the thermal adapter connector.

Figure 8:
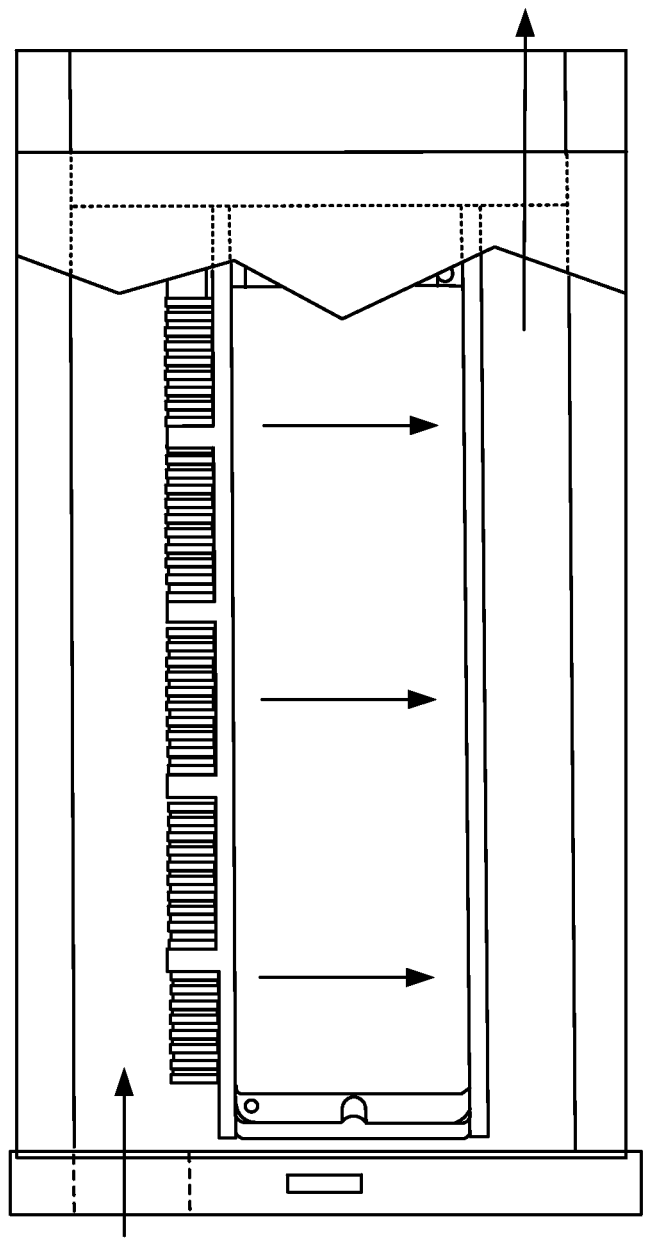

FIG. 8 illustrates an exemplary air flow plan. In practice, the thermal adapters may each be inserted in to a test slot assembly, which are here omitted for clarity. The nest, heating element, cover, and connector, are also omitted for clarity. In the example, an array of thermal adapters is oriented so that each thermal adapter's smallest exterior planar dimension faces the same direction. This orientation presents the minimum area to an operator or automated transporter. In this example, the smallest planar dimension of the cavity formed by the walls of the thermal adapter is substantially parallel to and aligned with the smallest planar dimension of the exterior of the thermal adapter. In this example, the volume in front of the thermal adapters also serves as a reservoir for a common source of air. In this orientation, the air flow that requires the minimum space and allows for the closest spacing between thermal adapters is oriented in parallel with the longitudinal axis of the thermal adapter. For the same reasons, the object to be contained in the temperature controlled by the thermal adapter is similarly oriented, with its smallest planar dimension oriented in parallel with the smallest planar dimension of the cavity in the thermal adapter. By aligning the smallest planar dimension of the object, the cavity, and the thermal adapter, the array of thermal adapters can be configured to minimize the area presented to the operator or automated transporter.

Figure 10:
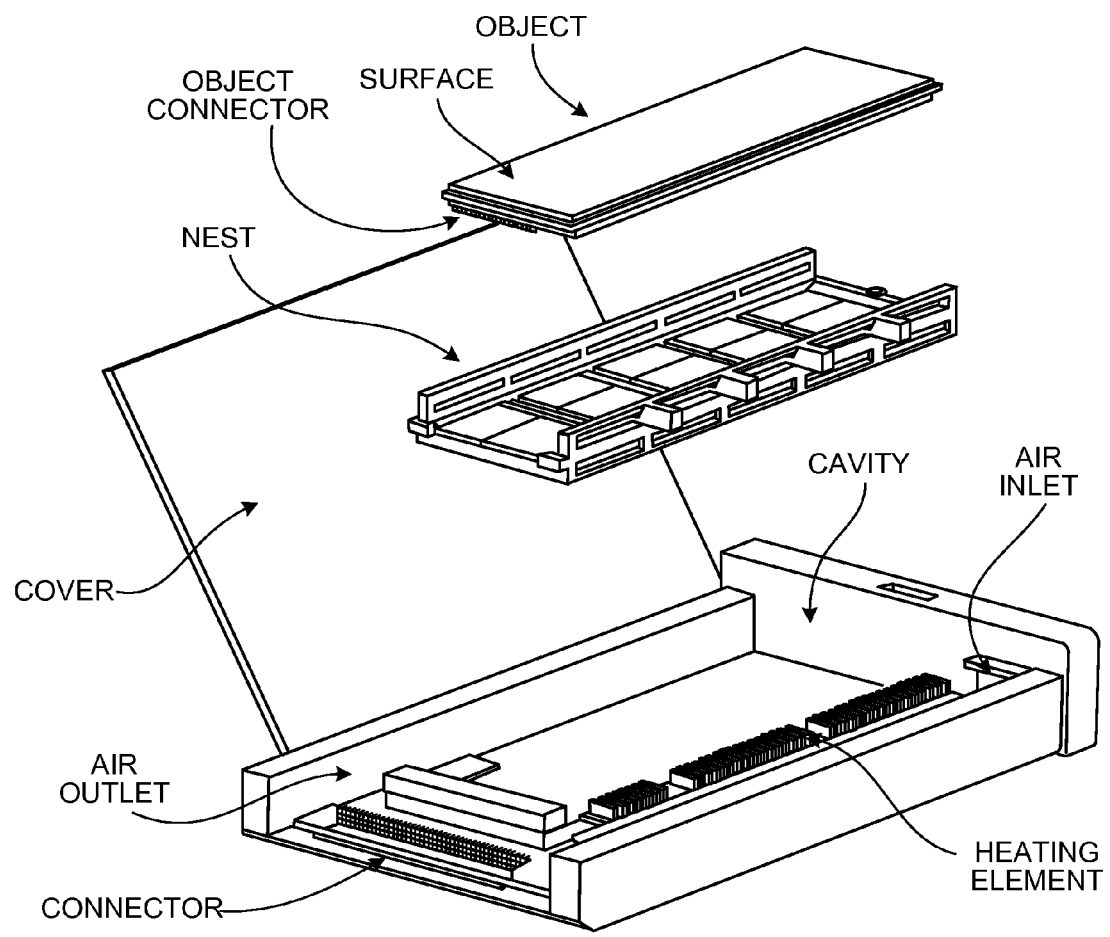
Figure 13:
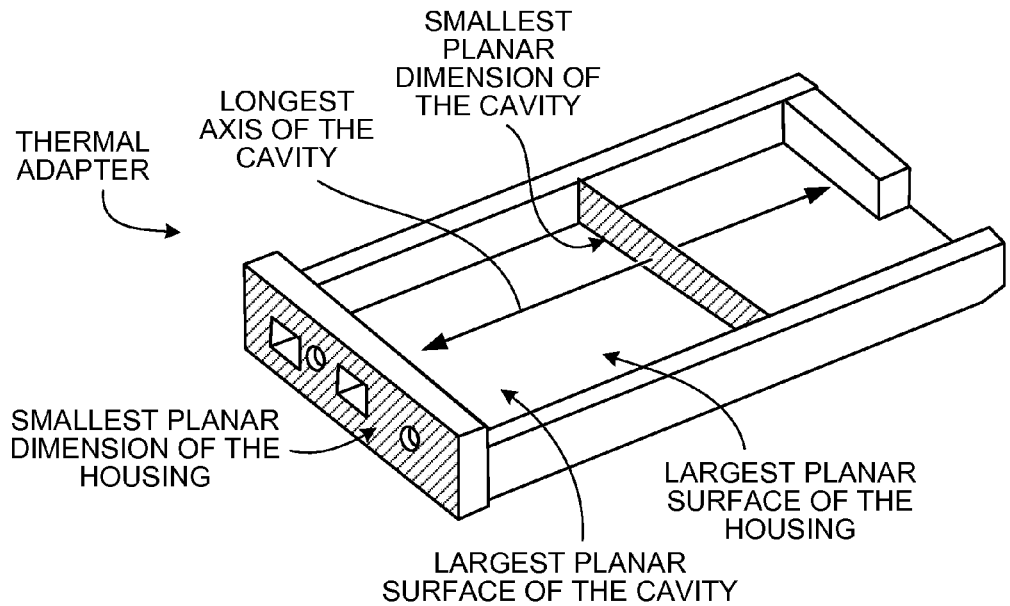
Figure 13:
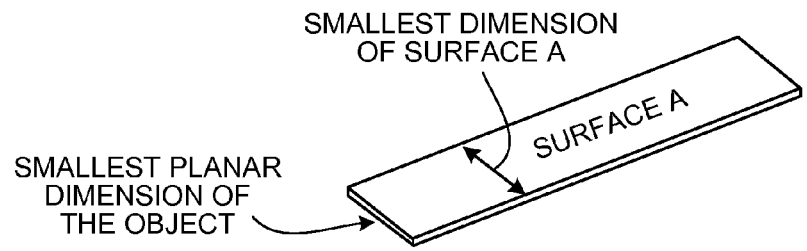
Figure 13:
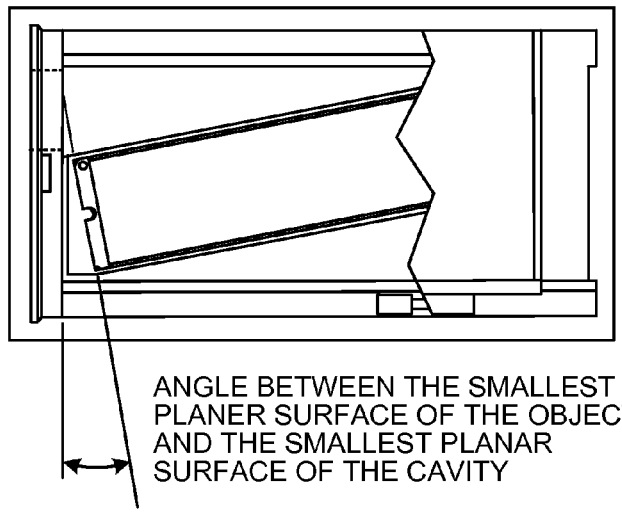
Figure 14:
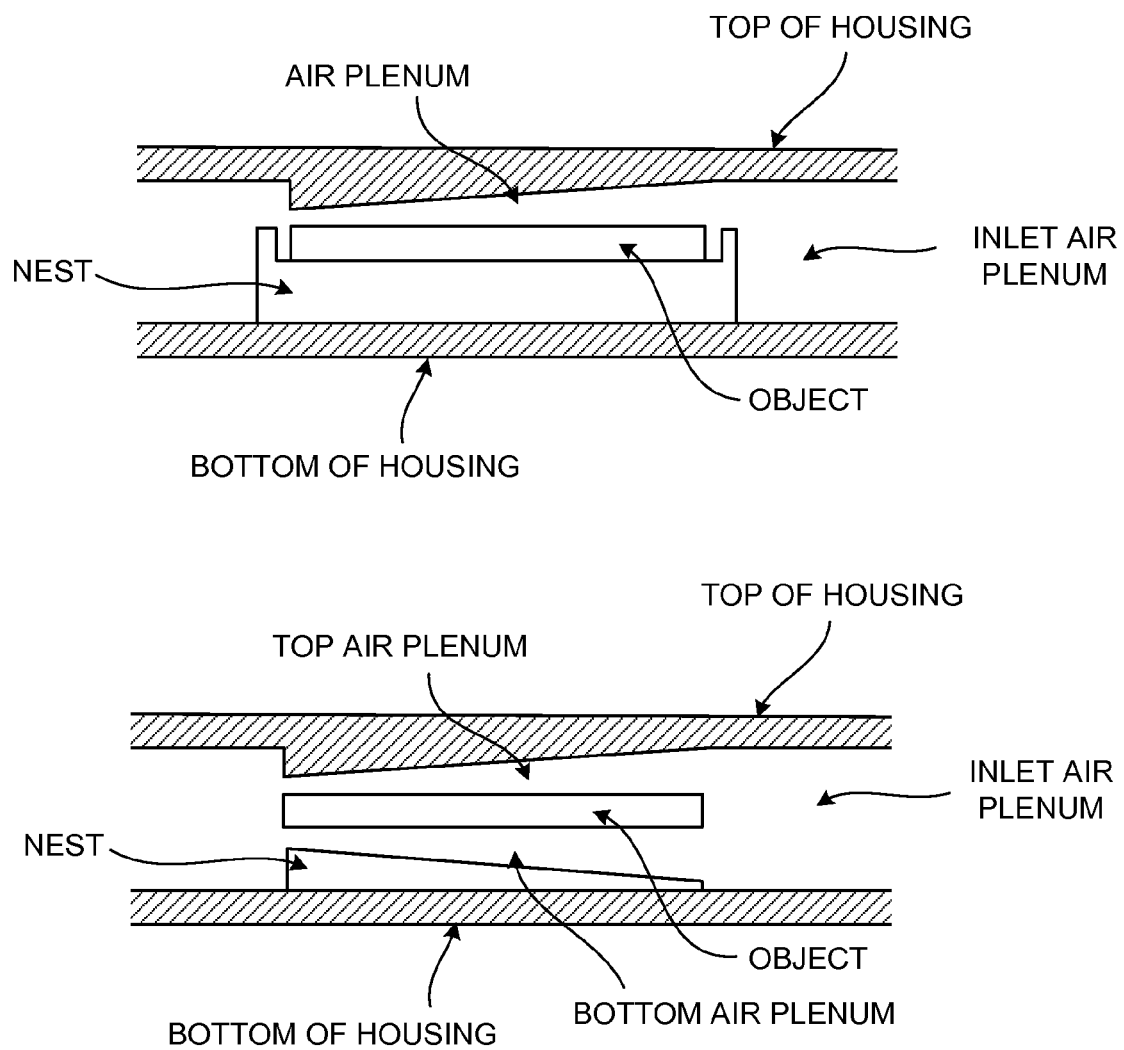

FIGS. 10 and 13-14 also illustrate an exemplary object that is to be temperature controlled. In the example, the preferred air flow is over the top surface of the object, in parallel with the smallest planar dimension of the object, and at right angles to the longitudinal axis of the object. Because the dimensions and orientation of the cavity has been optimized as described above, the object can only be placed with its longitudinal axis substantially in parallel with the longitudinal axis of the cavity, and thus with the longitudinal axis of the object in parallel with the air flow through the cavity. This orientation presents the minimum area to the operator or automated transporter, but it does not allow the preferred air flow across the top surface of the object.

Figure 9:
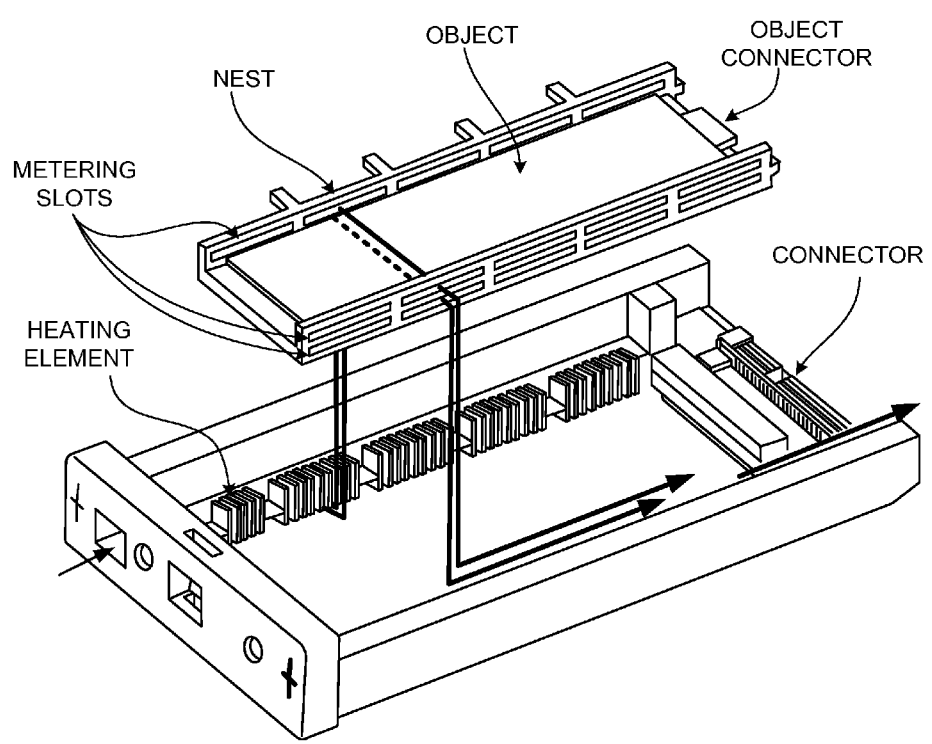

Referring to FIG. 9 the air flow path for one implementation of the thermal adapter is shown. An air pressure difference between the air inlet and the air outlet of the thermal adapter is created by air movers in the rack, the air mover in the test slot assembly, or both. The volume and velocity of the air flow may be varied by control of one or more of the air movers. As a result of the air pressure difference, air will flow through the air inlet. In implementations comprising an inlet side thermal sensor, the air will pass over the inlet side thermal sensor. In implementations comprising a heating element, the air will pass through the heating element. The nest may incorporate metering slots, which direct air flow over one or more surfaces of the object. For example, in FIG. 9 the air is directed over the top and bottom surfaces. The metering slots may be configured to be of varying sizes, to optimize air flow over the various surfaces, depending on the shape and thermal profile of the object. After flowing over the object surfaces, the air once more passes through metering slots, and exits through the air outlet. In implementations comprising an outlet side thermal sensor, the air will pass over the outlet side thermal sensor. Additional features (not shown) may be incorporated in the cover and/or the nest to create confined pathways for the air flow over the surface of the object from one metering slot to the opposing metering slot.

Figure 11:
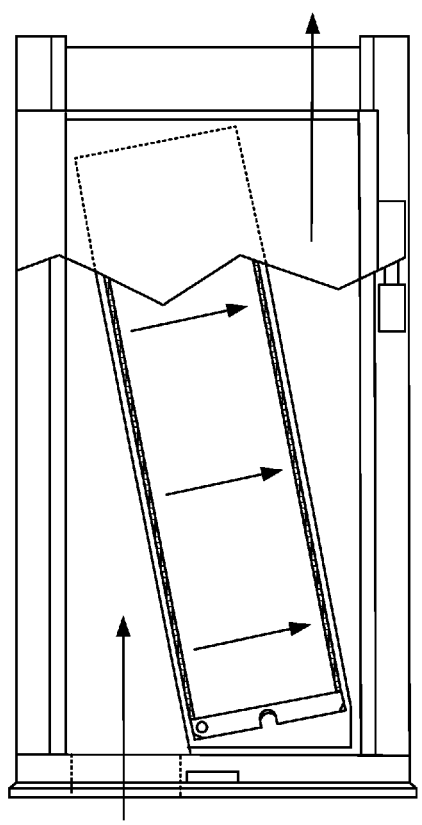

Another implementation of the thermal adapter is shown in FIG. 11. In this implementation, the object is supported in an orientation so that the longitudinal axis of the object is aligned with the diagonal of the cavity as much as possible. This orientation may allow the cavity to have decreased size, e.g., relative to the size of another cavity that is supporting the same object. The inlet air plenum thus formed by the walls of the thermal adapter and the object is substantially wedge-shaped. In this implementation, the change in direction of the air flow is less than 90°, thus reducing the pressure head and increasing the overall velocity of the air flow through the thermal adapter. The size of the air inlet is also larger than when the longitudinal axis of the object is substantially perpendicular to the smallest planar dimension of the cavity. The decreased cross-sectional area of the air inlet plenum matches the decreased volumetric flow of air in the plenum in the same location, so that the overall flow is greater in a wedge-shaped air inlet plenum than in a rectangular plenum of the same volume.

Figure 12:
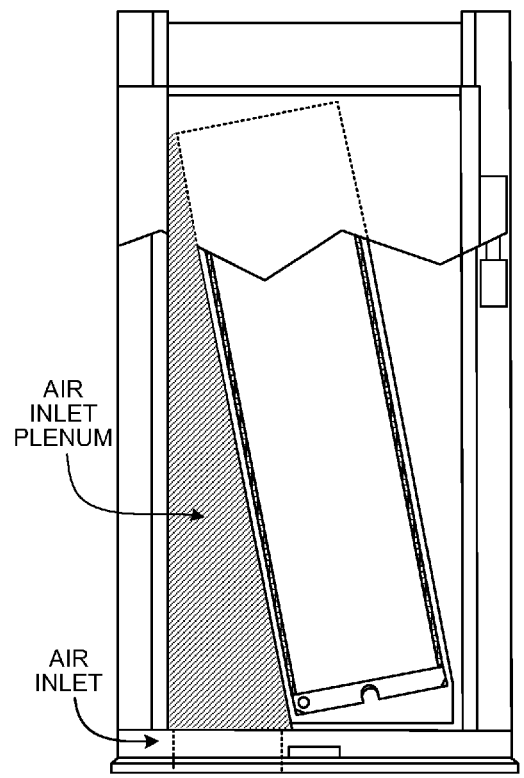

In the example of FIG. 12, the housing and/or nest are shaped so as to form a plenum with a decreasing cross-sectional area above and/or below the object. The velocity of the air increases as the cross-sectional area of the plenum decreases. Since the efficiency of heat transfer is proportional to the velocity of the air, the heat transfer from the object to the air or air to the object is greater in the places where the cross-sectional area of the plenum is smaller. In some implementations, a gradual reduction in the cross-sectional area of the plenum can compensate for a the reduced heat transfer between the object and the air, caused by the gradual reduction in the temperature difference between the air and the object, caused by the heat transfer between the air and the object, as the air flows over the object surface.

Planar Dimensions

Figure 5:
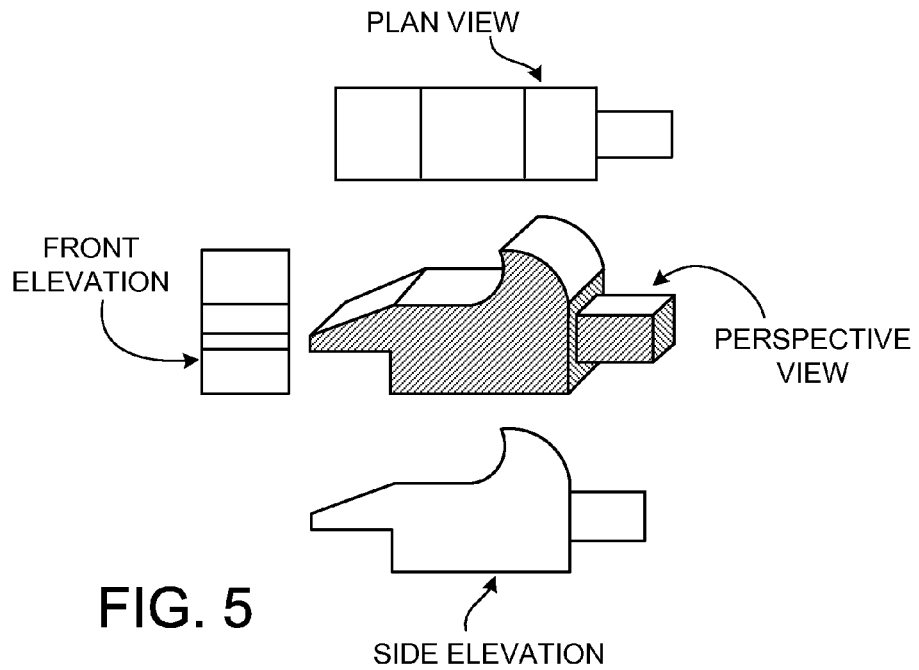

FIG. 5 provides a method for determining the smallest planar dimension of an object. The exemplary object is shown both in perspective view and in three planar projections: the front elevation, the side elevation, and the plan view. The area of each planar projection may be measured and the smallest one chosen. Planar projections must be obtained for all possible combinations of rotations along three orthogonal axes to obtain a complete set.

A number of implementations have been described. Nevertheless, it will be understood that various modifications may be made without departing from the spirit and scope of the disclosure.

In some implementations, the object may be a printed circuit board assembly, an integrated circuit, an integrated circuit carrier, an assembled electrical, electronic, or electromechanical device, a biological sample, a material sample, or any other device, material, sample, or assembly that may benefit from thermal control during manufacture or test. In some implementations, the thermal adapter may comprise only parts of a housing, and the enclosure is only completed when the thermal adapter is supported by the test slot. In some implementations, the thermal adapter may comprise features more suited to manipulation by a human operator than by an automated transporter.

In some implementations, the cavity that contains the object may not have its smallest planar dimension in parallel with the thermal adapter's smallest exterior planar dimension. In some implementations, the object may be placed in the housing by removing or opening one of the sidewalls of the housing and placing the object in the nest, rather than by removing and replacing the top cover. In some implementations, the thermal adapter and the test slot assembly may form a single assembly, with the thermal adapter not being readily removable from the single assembly.

In some implementations, the object may be directly manipulated by the automated transporter or human operator. In some implementations, the nest may include features to direct air only over the top surface of the object, or only over the bottom surface of the object.

In some implementations, the air inlet and air outlet may be located in the side walls, top, or bottom of the housing. In some implementations, the nest may be formed as part of the housing.

In some implementations, the nest may form some part of the walls of the housing. In some implementations, different nests may be used to adapt the housing to support objects with different geometries or power dissipations. In some implementations, different thermal adapters may be used in the same test slot, to support objects with different geometries or power dissipations. In some implementations, the thermal adapter may comprise multiple nests, each configured to support at least one object within the same cavity. In some implementations, the thermal adapter may comprise multiple cavities, each configured to support at least one object.

The implementations disclosed show the housing oriented so that the smallest planar dimension of the housing is facing the human operator or automated transporter, and the longest linear dimension of the facing plane is substantially horizontal. In some implementations, the longest linear dimension of the facing plane may be in orientations other than the substantially horizontal.

Other Embodiments

Other details and features combinable with those described herein may be found in the following U.S. patent applications filed Dec. 18, 2007, entitled "DISK DRIVE TESTING", inventors: Edward Garcia et al., and having assigned Ser. No. 11/958,817; and "DISK DRIVE TESTING", inventors: Edward Garcia et al., and having assigned Ser. No. 11/958,788. Other details and features combinable with those described herein may also be found in the following U.S. patent applications filed Apr. 17, 2008, entitled "Disk Drive Emulator And Method Of Use Thereof", inventors: Edward Garcia, and having assigned Ser. No. 12/104,594; "Transferring Disk Drives Within Disk Drive Testing Systems", inventors: Evgeny Polyakov et al., and having assigned Ser. No. 12/104,536; "Bulk Feeding Disk Drives To Disk Drive Testing Systems," inventors: Scott Noble et al., and having assigned Ser. No. 12/104,869; and "Vibration Isolation within Disk Drive Testing Systems", inventor: Brian Merrow, and having assigned Ser. No. 12/105,105, and U.S. Pat. No. 7,929,303 and U.S. application Ser. Nos. 12/698,575, and 12/815,140. The entire contents of each of the aforementioned applications are hereby incorporated by reference.

A number of implementations have been described. Nevertheless, it will be understood that various modifications may be made without departing from the spirit and scope of the disclosure. Accordingly, other implementations are within the scope of the following claims.

What is claimed is:

1. An apparatus for controlling the temperature of an object, comprising:
    a housing comprising:
        a cavity configured adapted to accept the object, with the cavity comprising a first planar dimension and a second planar dimension, with the first planar dimension of the cavity being smaller than the second planar dimension of the cavity;
        wherein the object comprises a first planar dimension and a second planar dimension, with the first planar dimension of the object being smaller than the second planar dimension of the object;
        an air inlet configured to allow air to flow into the cavity; and
        an air outlet configured to allow air to flow out of the cavity; and
    a nest configured to hold the object within the housing such that the first, smaller planar dimension of the object is substantially aligned with the first, smaller planar dimension of the cavity;
    wherein the nest and the housing are configured to direct air flow from the air inlet, across at least one surface of the object and substantially in parallel with the first, smaller planar dimension of the object, to the air outlet.

2. The apparatus of claim 1, wherein an aspect ratio of the largest planar surface of the housing is greater than 2:1.

3. The apparatus of claim 1, wherein the nest is configured to be removable from the housing.

4. The apparatus of claim 1, further comprising a heating element disposed in a path between the air inlet and the object, with the heating element differing from the object.

5. The apparatus of claim 1, further comprising a temperature sensor.

6. The apparatus of claim 1, wherein the first, smaller planar dimension of the cavity is substantially parallel to a smallest planar dimension of the housing.

7. The apparatus of claim 1, wherein the air inlet is placed in the first, smaller planar dimension of the cavity.

8. The apparatus of claim 7, wherein the air outlet is placed so the air flow from the air inlet to the air outlet is along a longest axis of the cavity.

9. The apparatus of claim 1, wherein an angle between the first, smaller planar dimension of the object and the first, smaller planar dimension of the cavity is less than 20 degrees.

10. An apparatus for controlling the temperature of an object, comprising:
    a housing comprising:
        a cavity configured to accept the object, with the cavity comprising a first planar dimension and a second planar dimension, with the first planar dimension of the cavity being larger than the second planar dimension of the cavity;
        wherein the object comprises at least one surface with a first linear dimension and a second linear dimension, with the first linear dimension of the at least one surface of the object being larger than the second linear dimension of the at least one surface of the object;
        an air inlet configured to allow air to flow into the cavity; and
        an air outlet configured to allow air to flow out of the cavity; and
    a nest configured to hold the object within the housing such that the first, larger linear dimension of the at least one surface of the object is substantially aligned with a diagonal of the first, larger planar dimension of the cavity;
    wherein the nest and the housing are configured to direct air flow from the air inlet, across the at least one surface of the object and substantially in parallel with the second, smaller linear dimension of the at least one surface of the object, to the air outlet.

11. The apparatus of claim 10, wherein an aspect ratio of the largest planar surface of the housing is greater than 2:1.

12. The apparatus of claim 10, wherein the nest is configured to be removable from the housing.

13. The apparatus of claim 10, further comprising a heating element disposed in a path between the air inlet and the object, with the heating element differing from the object.

14. The apparatus of claim 10, further comprising a temperature sensor.

15. The apparatus of claim 10, further comprising: a substantially wedge-shaped air inlet plenum between the air inlet and the object.

16. The apparatus of claim 10, further comprising: an air plenum with a progressively reduced cross-sectional area disposed between the housing and the at least one surface of the object.

* * * * *